United States Patent
Ishii et al.

(10) Patent No.: US 7,932,946 B2
(45) Date of Patent: Apr. 26, 2011

(54) IMAGING APPARATUS AND RADIATION IMAGING SYSTEM

(75) Inventors: Takamasa Ishii, Honjo (JP); Chiori Mochizuki, Sagamihara (JP); Minoru Watanabe, Honjo (JP)

(73) Assignee: Canon Kabushiki Kaisha, Tokyo (JP)

(*) Notice: Subject to any disclaimer, the term of this patent is extended or adjusted under 35 U.S.C. 154(b) by 341 days.

(21) Appl. No.: 12/185,445

(22) Filed: Aug. 4, 2008

(65) Prior Publication Data
US 2009/0040348 A1 Feb. 12, 2009

(30) Foreign Application Priority Data
Aug. 7, 2007 (JP) .................... 2007-205472

(51) Int. Cl.
- H04N 3/14 (2006.01)
- H01L 27/00 (2006.01)
- G01T 1/20 (2006.01)
- H05G 1/64 (2006.01)

(52) U.S. Cl. ........ 348/294; 348/302; 348/304; 348/308; 348/307; 250/208.1; 250/370.11; 378/98.8

(58) Field of Classification Search .......... 348/302, 348/304, 307, 308, 222.1, 294; 250/370.09, 250/370.11, 208.1; 257/414, 443, 232; 378/98.8, 378/97, 98.11

See application file for complete search history.

(56) References Cited

U.S. PATENT DOCUMENTS

| | | | | |
|---|---|---|---|---|
| 7,205,547 | B2 * | 4/2007 | Ishii et al. | 250/370.09 |
| 7,381,965 | B2 * | 6/2008 | Ishii et al. | 250/370.11 |
| 7,470,908 | B2 * | 12/2008 | Ishii et al. | 250/370.08 |
| 7,629,564 | B2 * | 12/2009 | Mochizuki et al. | 250/208.1 |
| 7,655,920 | B2 * | 2/2010 | Mochizuki et al. | 250/371 |
| 2002/0005520 | A1 * | 1/2002 | Mochizuki et al. | 257/74 |
| 2004/0223587 | A1 * | 11/2004 | Tsujii | 378/97 |
| 2005/0274991 | A1 | 12/2005 | Ishii et al. | 257/232 |
| 2007/0007458 | A1 * | 1/2007 | Mochizuki et al. | 250/370.09 |

FOREIGN PATENT DOCUMENTS
JP 2007-049123 A 2/2007
WO WO 2007-007881 A1 1/2007

* cited by examiner

Primary Examiner — Lin Ye
Assistant Examiner — Marly Camargo
(74) Attorney, Agent, or Firm — Fitzpatrick, Cella, Harper & Scinto (57) ABSTRACT

The present invention aims to provide an imaging apparatus capable of reducing image unevenness even if a protective layer including a polarized solvent is used. The imaging apparatus of the present invention includes a plurality of pixels each having a conversion element and a TFT connected to the conversion element, a protective layer disposed over the plurality of pixels, a plurality of bias lines each electrically connected to each of the conversion elements, and a plurality of signal lines each electrically connected to each of the TFT. Then, the plurality of bias lines and the plurality of signal lines are alternately disposed at a predetermined interval within a region in the protective layer. Then, the plurality of bias lines is commonly connected through a connecting wiring on the outside of the region in the protective layer, and the connecting wiring is disposed to cross the plurality of signal lines.

5 Claims, 8 Drawing Sheets

IMAGING APPARATUS AND RADIATION IMAGING SYSTEM

BACKGROUND OF THE INVENTION

1. Field of the Invention

The present invention relates to an imaging apparatus for detecting a light, or an imaging apparatus to be used for a medical image diagnosis apparatus, a nondestructive inspection apparatus, an analyzer using a radiation, or the like, and a radiation imaging system.

2. Description of the Related Art

In recent years, the manufacturing technique of a panel for a liquid crystal display using thin film transistors (TFTs) has progressed, and the screen enlargement of a display unit has been progressing together with the panel enlargement thereof. The manufacturing technique has been applied to a large-area area sensor including conversion elements made of a semiconductor (such as a photoelectric conversion element) and switch elements, such as TFTs. Such an area sensor (radiation detecting panel) has been used in a field of a radiation detecting apparatus, such as a medical X-ray detecting apparatus, by being combined with a scintillator converting a radiation, such as an X-ray, into a light, such as a visible light.

US 2005/0274991 discloses a radiation detecting apparatus preventing the capacity degradation or the breakage of devices owing to static electricity even if a radiation detecting panel is charged at a manufacturing process. The radiation detecting apparatus includes a plurality of semiconductor conversion elements converting a radiation into charges, which conversion elements are disposed in a matrix on an insulating substrate. Moreover, the radiation detecting apparatus includes switch elements connected to the semiconductor conversion elements, bias lines (Vs lines) for applying biases to the conversion elements, gate lines (Vg lines) for supplying drive signals to the switch elements, and signal lines (Sig lines) for reading charges converted by the conversion elements. Then, a plurality of some of the same kind lines is connected to the wiring including a photoelectric conversion layer in the out of the pixel region.

US 2005/0274991 discloses an example in which the Vs lines are commonly connected through Vs connecting wiring in the neighborhood of pixels and the commonly connected Vs lines are connected to a TCP-A connecting pad, which is an external circuit connection electrode at the endmost part, with leading wiring. If a protective layer, made of polyimide or the like, using a solvent having a polarity is provided above each pixel and each piece of wiring in such a configuration, then image unevenness, which deteriorates the image quality of the radiation detecting panel, is sometimes caused.

SUMMARY OF THE INVENTION

Accordingly, it is an object of the present invention to provide an imaging apparatus and a radiation imaging system, both capable of reducing their image unevenness.

The imaging apparatus according to the present invention includes a sensor substrate for converting an incident radiation into an electric signal, wherein the sensor substrate comprises a plurality of pixels each having a conversion element and a switching element connected to the conversion element, a protective layer disposed over the plurality of pixels, a plurality of bias lines each electrically connected to each of the conversion elements, and a plurality of signal lines each electrically connected to each of the switching elements. Then, the plurality of bias lines and the plurality of signal lines are alternately disposed at a predetermined interval within a region in the protective layer, wherein the plurality of bias lines are commonly connected through a connecting wiring at outside of the region in the protective layer, and wherein the connecting wiring is disposed to cross the plurality of signal lines.

This configuration enables the present invention to reduce the image unevenness even if a protective layer including a polarized solvent is used.

Further features of the present invention will become apparent from the following description of exemplary embodiments with reference to the attached drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DESCRIPTION OF THE EMBODIMENTS

In the following, exemplary embodiments for implementing the present invention will be described in detail with reference to the attached drawings. Incidentally, in the description, a radiation implies a visible light, an infrared ray, an X-ray, a γ-ray, and particle beams, such as an α-ray and a β-ray. Moreover, a conversion element means a semiconductor element converting at least a light signal or radiation such as an X-ray, a γ-ray, and particle beams, such as an α-ray and a β-ray into an electric signal.

First Embodiment

Figure 1:
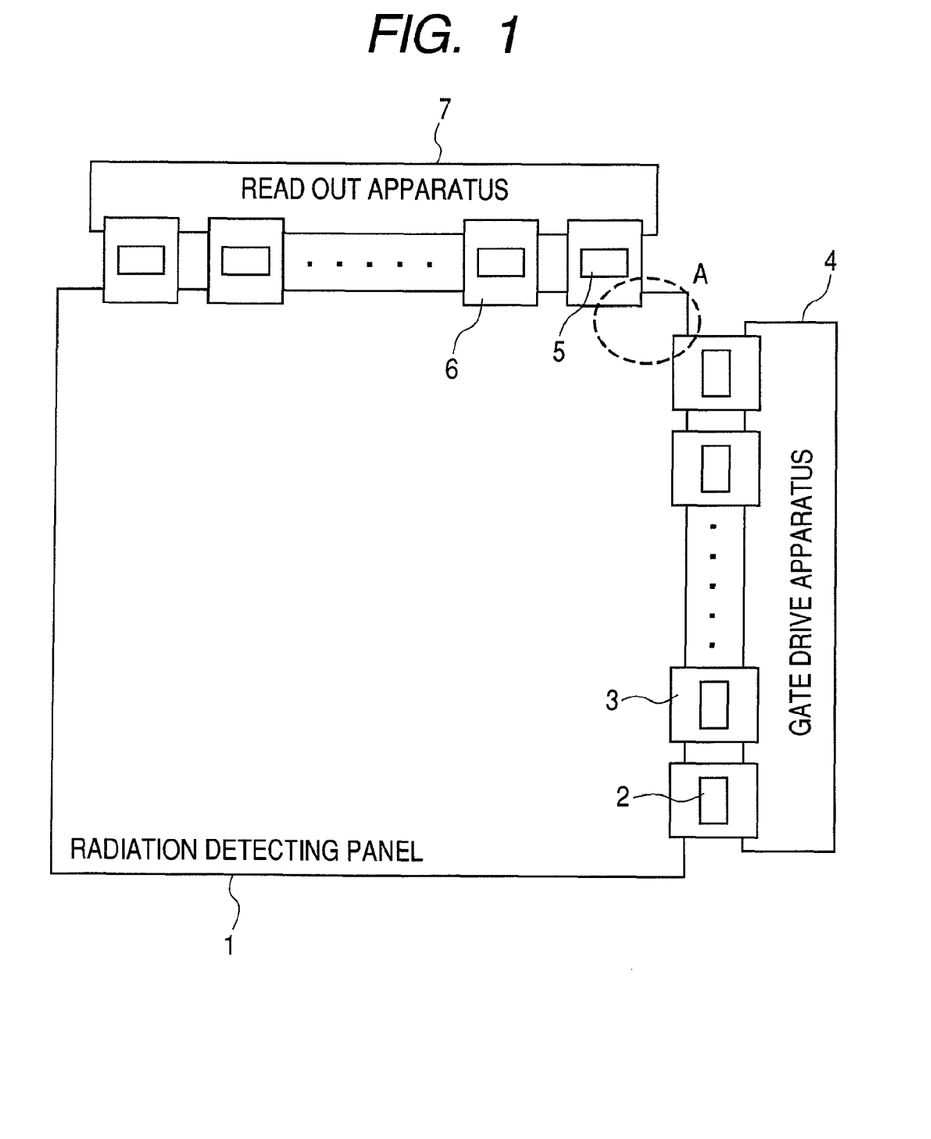
FIG. 1 is a plan view illustrating an imaging apparatus according to a first embodiment of the present invention.
Figure 2:
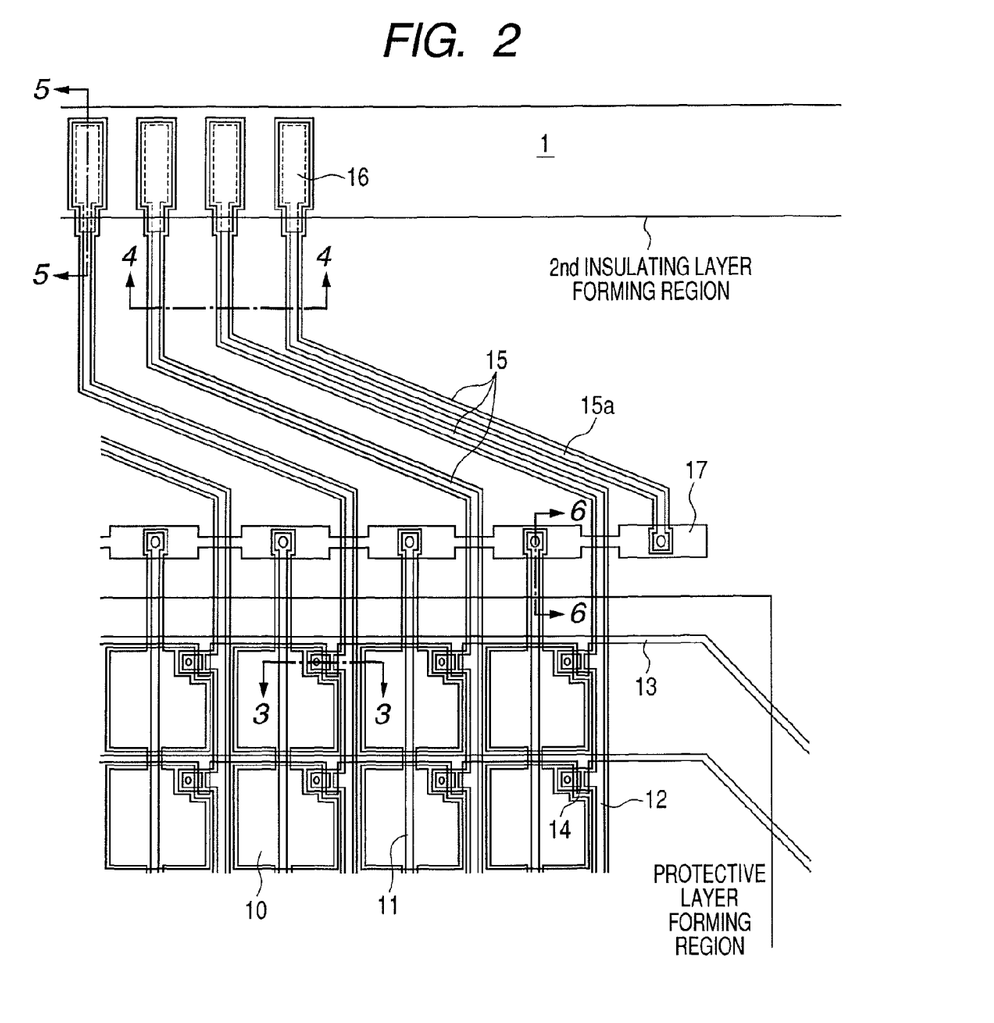
FIG. 2 is a plan view illustrating an enlarged A part of FIG. 1.
Figure 3:
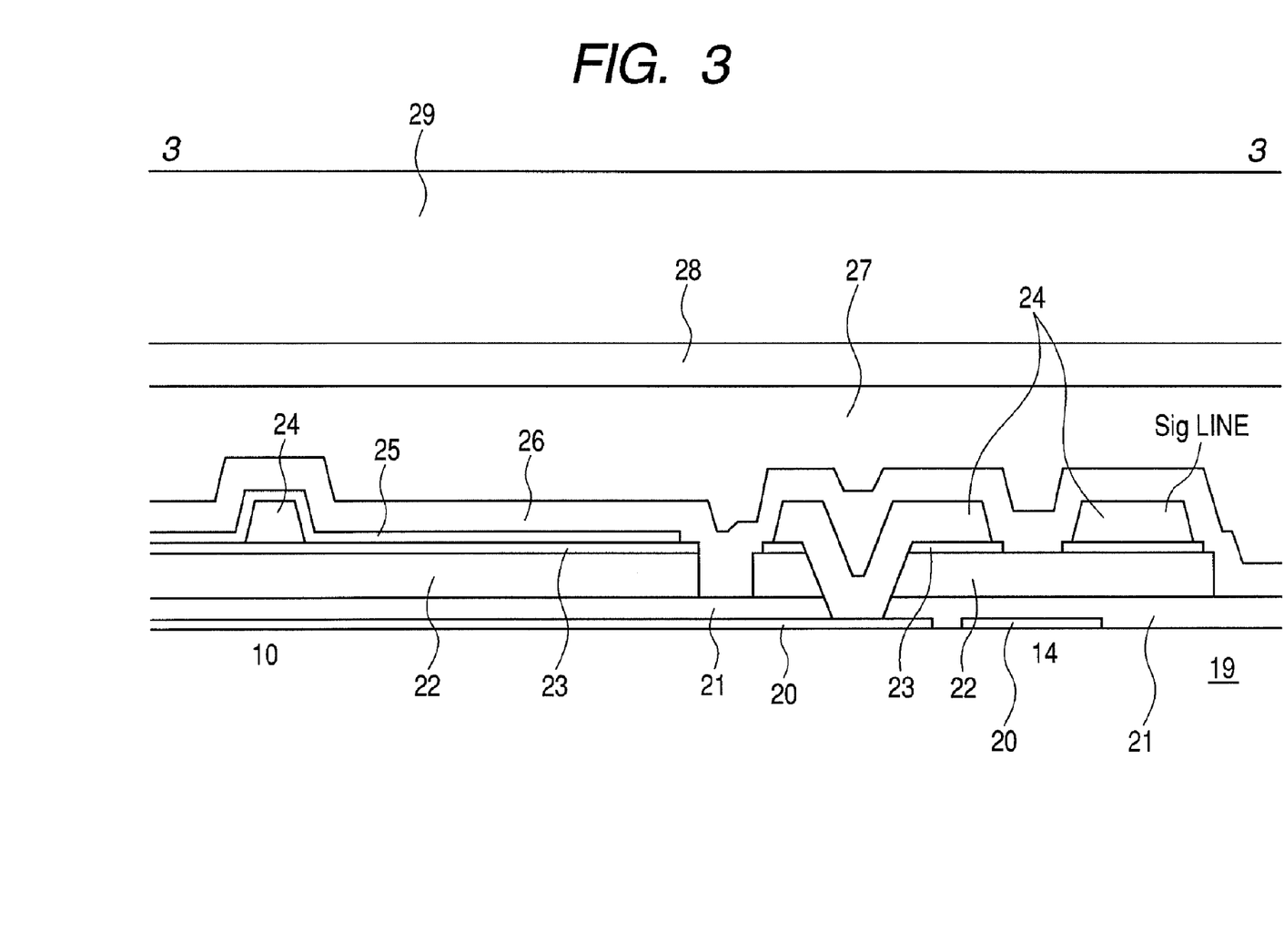
FIG. 3 is a sectional view of a pixel taken along a line 3-3 in FIG. 2.
Figure 4:
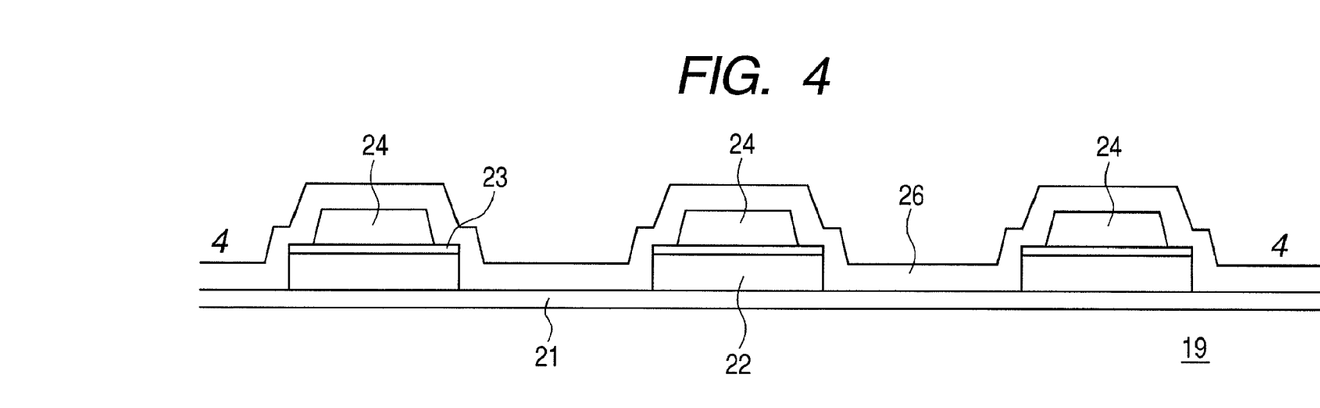
FIG. 4 is a sectional view taken along a line 4-4 in FIG. 2.
Figure 5:
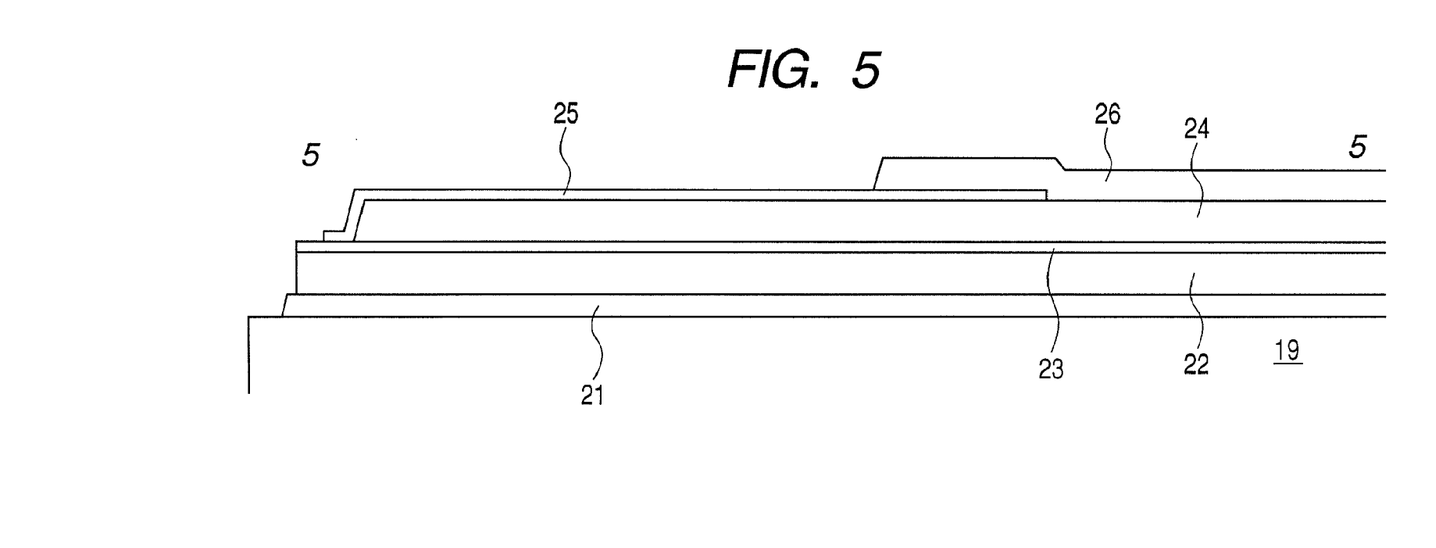
FIG. 5 is a sectional view taken along a line 5-5 in FIG. 2.
Figure 6:
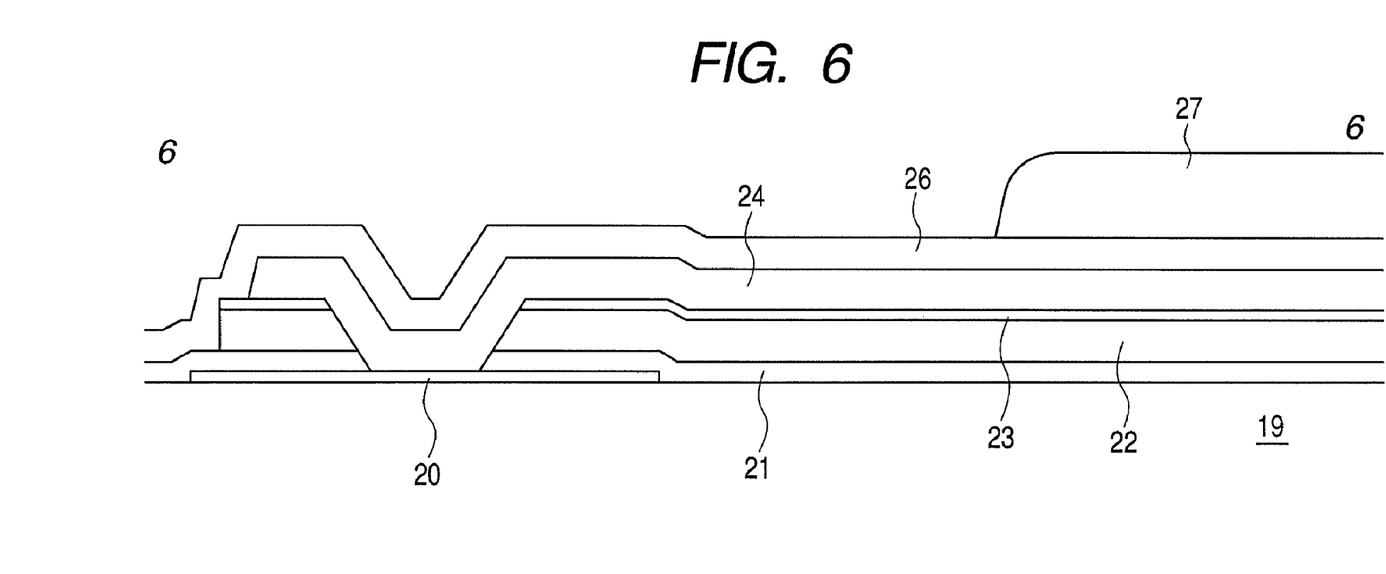
FIG. 6 is a sectional view taken along a line 6-6 in FIG. 2.

FIG. 1 is a plan view illustrating a first embodiment of an X-ray imaging apparatus as an imaging apparatus according to the present invention, and FIG. 2 is a plan view illustrating an enlarged A part in FIG. 1. Moreover, FIG. 3 is a sectional view of a pixel taken along a line 3-3 in FIG. 2; FIG. 4 is a sectional view taken along a line 4-4 in FIG. 2; FIG. 5 is a sectional view taken along a line 5-5 in FIG. 2; and FIG. 6 is a sectional view taken along a line 6-6 in FIG. 2. In each drawing, a scintillator layer converting a radiation such as an X-ray into a visible light is not illustrated.

As illustrated in FIG. 1, the X-ray imaging apparatus includes a radiation detecting panel 1 as a sensor substrate, and the radiation detecting panel 1 is connected to a gate drive apparatus 4 including drive circuits 2, which are external circuits, through drive circuit connecting units 3. Moreover, the radiation detecting panel 1 is connected to a read-out apparatus 7 including read-out circuits 5, which are external circuits, through read-out circuit connecting units 6. The gate drive apparatus 4 controls the turning-on and turning-off of switch elements (TFTs) 14 (see FIG. 2), and the read-out apparatus 7 reads the signals from the TFTs to the outside.

Next, the principal of operation of the present embodiment is described with reference to FIG. 2. External circuit connection electrodes 16 of FIG. 2 are connected to the read-out circuit connecting units 6 of FIG. 1, and the signal lines and bias lines of the radiation detecting panel 1 are connected to the read-out circuits 5 of FIG. 1 through the external circuit connection electrodes 16.

First, biases are applied onto bias lines (Vs lines) 11 so that the photoelectric conversion layers of metal-insulator semiconductor (MIS) type photoelectric conversion elements 10, which are conversion elements, may be depleted. For example, the reference potential (GND) is applied to signal lines (Sig lines) 12, and 10 V is applied to the Vs lines 11. In this state, an X-ray radiated toward a subject to be examined penetrates the subject while being attenuated by the subject, and is converted into a visible light by a not-shown scintillator layer. The converted visible light enters the conversion elements 10 and is converted into charges.

The charges are transferred to the Sig lines 12 through the switch elements 14 by the gate drive pulses applied from the gate drive apparatus 4 to gate lines (Vg lines) 13, and are read to the outside by the read-out apparatus 7. After that, the residual charges that have been generated in the conversion element 10 and have not been transferred are removed by potential changes of the Vs lines 11. At this time, the Vs lines 11 changes, for example, from 10 V to −5 V. The removal of the residual charges may be performed by using the TFTs 14.

Next, the layer configuration of the radiation detecting panel 1 is described with reference to FIG. 3. The MIS type photoelectric conversion elements 10 include first electrode layers 20, a first insulating layer 21, and semiconductor layers (a-Si layers) 22, which are photoelectric conversion layers, which layers 20, 21, and 22 are formed on an insulating substrate 19 in the order. Moreover, the radiation detecting panel 1 includes impurity semiconductor layers 23, second electrode layers 24 forming the Vs lines 11, and third electrode layers 25, which layers 23, 24, and 25 are formed in the order. The third electrode layers 25 constitute the electrodes for applying the bias voltages supplied from the Vs lines 11 to all of the MIS type photoelectric conversion elements 10.

The TFTs 14 include the first electrode layers 20 constituting gate electrodes and the Vg lines 13, the first insulating layer 21, the semiconductor layers (a-Si layers) 22, which are channel layers, the impurity semiconductor layers 23, and the second electrode layers 24 constituting the Sig lines 12 together with source electrodes or drain electrodes, which layers 20, 21, 22, 23, and 24 are formed on the insulating substrate 19 in the order. On the upper sides of the MIS type photoelectric conversion elements 10 and the TFTs 14, a second insulating layer 26, a protective layer 27, a bonding layer 28, and a scintillator layer 29 performing the wavelength conversion of X-rays into visible lights are formed in the order. FIG. 3 illustrates an example of the simplification of a manufacturing process by forming the MIS type photoelectric conversion elements 10 and the TFTs 14 in the same layer at the same time.

Moreover, FIG. 4 is the sectional view taken along the line 4-4 of FIG. 2 as mentioned above, and illustrates the cross-sectional structure of leading wiring 15 illustrated in FIG. 2. In FIG. 4, the same parts as those of FIG. 3 are denoted by the same codes as those of FIG. 3. As illustrated in FIGS. 2 and 4, the structure of the leading wiring 15 connecting each piece of wiring (Sig lines 12 and Vs lines 11) with the external circuit connection electrodes 16 is formed of second electrode layers 24 commonly for the Sig lines 12 and the Vs lines 11.

FIG. 5 is the sectional view taken along the line 5-5 in FIG. 2, and illustrates the cross-sectional structure in the neighborhood of one of the external circuit connection electrodes 16. In FIG. 5, the same parts as those of FIG. 3 are denoted by the same codes as those of FIG. 3. As illustrated in FIGS. 2 and 5, the external circuit connection electrode 16 is formed of the corresponding second electrode layer 24 and the corresponding third electrode layer 25, and the upper second insulating layer 26 is removed in its configuration.

In the present embodiment, the impurity semiconductor layers 23, the semiconductor layers 22, and the first insulating layer 21 are disposed below the leading wiring 15 and the external circuit connection electrodes 16, but these layers 23, 22, and 21 are not necessarily needed to be disposed.

Here, the cause of the occurrence of image unevenness in the related art apparatus is examined. The polarized solvent included in a protective layer generally disappears in the curing process of the protective layer by heat. However, the polarized solvent sometimes remains in the protective layer as charges or ions in some curing conditions. The charges or the ions concentrate in the upper parts of the Vs lines 11 by the voltages applied onto the Vs lines 11 and function as electrodes to form capacity together with neighboring Sig lines 12.

The capacity is large on the Sig lines 12 situated at the positions near to the Vs lines 11, and is small on the Sig lines 12 situated at the positions far from the Vs lines 11. That is, a different piece of capacity is formed on each of the Sig lines 12, and consequently the image unevenness can be considered to be caused by the different pieces of capacity.

FIG. 6 is the sectional view taken along the line 6-6 of FIG. 2, and illustrates the cross-sectional structure of one of the Vs lines 11 to a corresponding part of the Vs connection electrode wiring 17. In FIG. 6, the same parts as those of FIG. 3 are denoted by the same codes as those of FIG. 3. As illustrated in FIGS. 2 and 6, each of the Vs lines 11 is commonly connected through the Vs connecting wiring 17 formed of the corresponding first electrode layer 20 in the neighborhood of the pixels on the outside of the forming regions of the protective layer 27. The Vs connecting wiring 17 is disposed to cross a plurality of Sig lines 12.

The commonly connected Vs lines 11 are connected to the external circuit connection electrode 16 in the endmost part with the leading wiring 15. Moreover the Vs connecting wiring 17 is disposed on the outside of the forming region of the protective layer 27, and this point is greatly different from that of the related art.

That is, the Vs lines 11 and the Sig lines 12 are alternately disposed, and the Vs lines 11 and the Sig lines 12 are disposed in almost the same intervals, in the region in which the protective layer 27 is formed. Consequently, even if the protective layer 27 using the polarized solvent is disposed, the parasitic capacitance of each of the signal lines 12 is substantially the same, and the image unevenness can be reduced.

Here disposition examples of the leading wiring 15 (leading wiring 15a) of the commonly connected Vs lines 11 is next illustrated.

(1) The leading wiring 15a is disposed only one end of the pixel region.

(2) The leading wiring 15a is disposed on both ends of the pixel region.

(3) The leading wiring 15a is disposed at both ends of each of the read-out circuit connecting units 6.

Any of the dispositions of the disposition examples can reduce the image unevenness.

Incidentally, FIG. 2 illustrates 2×4 pixels, but actually for example 2,000×2,000 pixels are disposed to constitute the radiation detecting panel 1 as a sensor substrate. Moreover, although the indirect type radiation detecting panel 1 combining the photoelectric conversion elements 10 and the scintillator layer 29 disposed above the photoelectric conversion elements 10 has been illustrated, the present invention is not limited to this type configuration.

For example, a direct type radiation detecting panel using the conversion elements putting the semiconductor layer such as amorphous selenium, which converts radiations, such as X-rays and γ-rays, into charges directly, between electrodes in place of the photoelectric conversion elements 10 can bring about similar effects.

Moreover, as the conversion elements of the indirect type radiation detecting panel, the photoelectric conversion elements other than the MIS type photoelectric conversion elements 10, for example, positive intrinsic negative (PIN) type photoelectric conversion elements may be also used. Furthermore, as for the pixel structure of the indirect type radiation detecting panel 1, the plane type pixel structure, in which the photoelectric conversion elements and switch elements are formed in the same layer, or the stacked type pixel structure, in which the photoelectric conversion elements are formed above the switch elements, may be adopted. Moreover, although the example of stacking the scintillator layer 29 above the protective layer 27 with the bonding layer 28 put between them has been illustrated, the scintillator layer such as CsI may be directly formed on the protective layer 27.

Moreover, although the description has been given to the imaging apparatus to detect an X-ray (X-ray imaging apparatus) as an example, the imaging apparatus to detect a radiation, such as a γ-ray, (radiation imaging apparatus) and an imaging apparatus to detect a light can be also applied to the present invention.

The present invention is an imaging apparatus including a sensor substrate for converting an incident radiation into an electric signal. The sensor substrate of the imaging apparatus includes a plurality of pixels each having one of the conversion element (MIS type photoelectric conversion element) 10 and one of the switch elements (TFTs) 14 connected to the conversion element 10, and the protective layer 27 disposed over the plurality of pixels. Furthermore, the sensor substrate includes the plurality of bias lines (Vs lines 11) each electrically connected to each of the conversion elements 10, and the plurality of signal lines (Sig lines) 12 each electrically connected to each of the switch elements 14.

Then, in the present invention, the plurality of bias lines 11 and the plurality of signal lines 12 are alternately disposed at a predetermined interval within a region in the protective layer 27. Then, the plurality of bias lines 11 is commonly connected through the Vs connecting wiring 17 on the outside of the region in the protective layer 27, and the Vs connecting wiring 17 is arranged to cross the plurality of signal lines 12. Consequently, even if the protective layer 27 using the polarized solvent is disposed as mentioned above, the parasitic capacitance of each of the signal lines 12 is substantially the same, and the image unevenness can be reduced.

Second Embodiment

Figure 7:
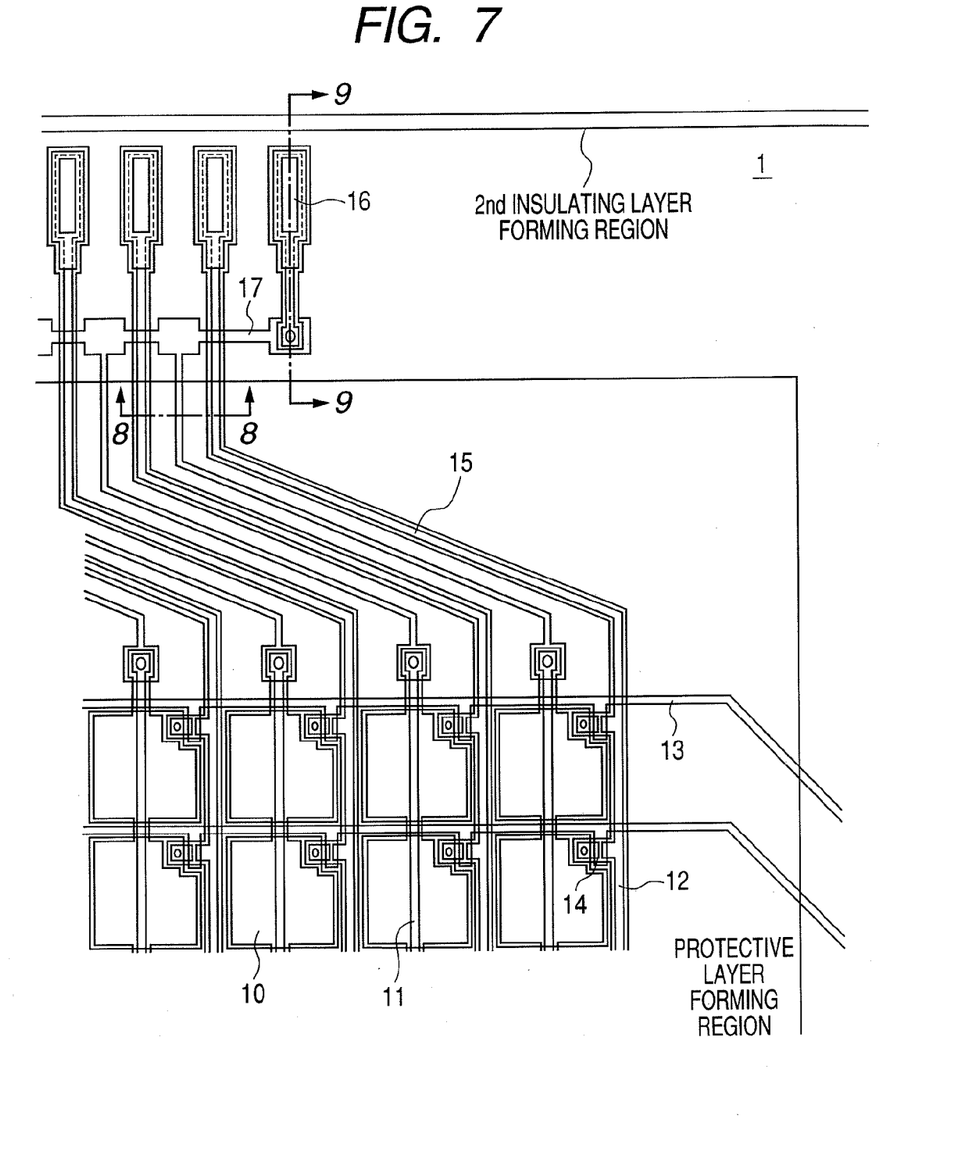
FIG. 7 is a plan view illustrating a second embodiment of the present invention.
Figure 8:
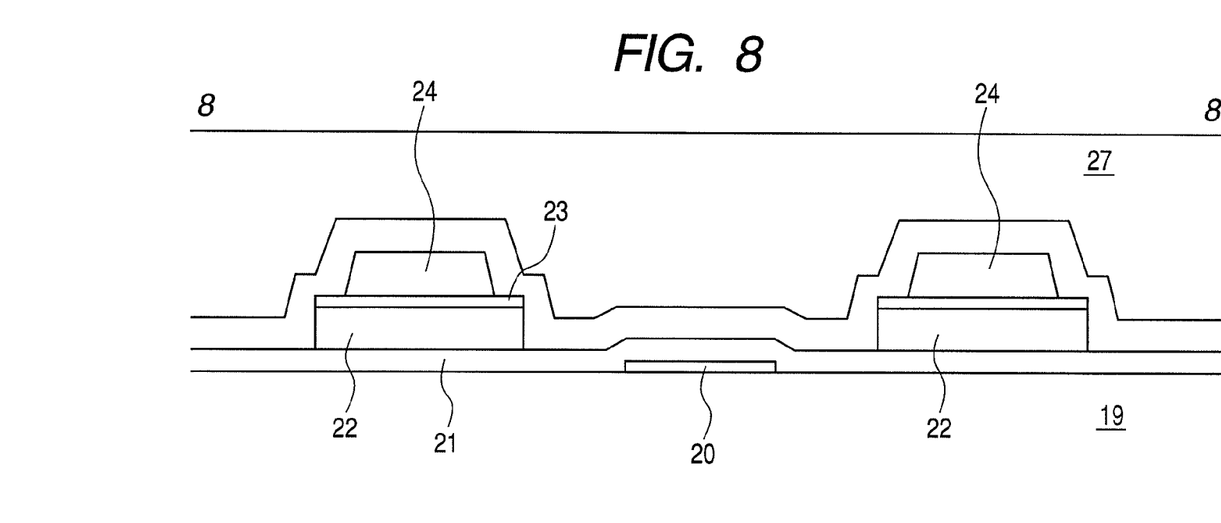
FIG. 8 is a sectional view taken along a line 8-8 in FIG. 7.
Figure 9:
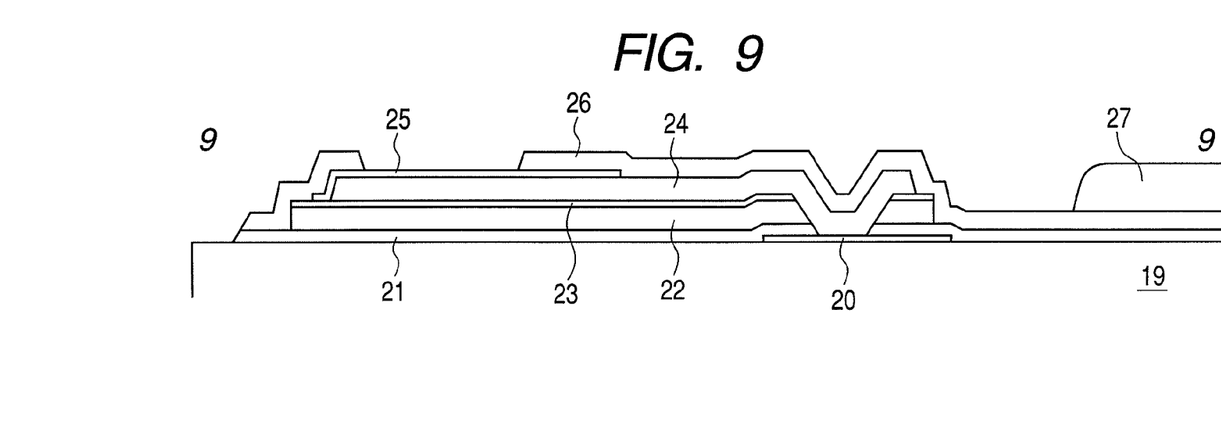
FIG. 9 is a sectional view taken along a line 9-9 in FIG. 7.

Next a second embodiment of the imaging apparatus of the present invention is described. The basic configuration and the principle of operation of the imaging apparatus of the present embodiment are the same as those of the first embodiment, and accordingly the detailed descriptions of them are omitted. FIG. 7 is a plan view illustrating the enlarged A part of FIG. 1; FIG. 8 is a sectional view taken along a line 8-8 of FIG. 7; and FIG. 9 is a sectional view taken along a line 9-9 of FIG. 7. In FIGS. 7 to 9, the same parts as those of FIGS. 2 to 6 are denoted by the same codes as those of FIGS. 2 to 6.

The present embodiment differs from the first embodiment in that the Vs connecting wiring 17 is disposed between the leading wiring 15 and the external circuit connection electrodes 16 as illustrated in FIG. 7. The other configurations of the present embodiment are the same as those of the first embodiment.

FIG. 8 is the sectional view taken along the line 8-8 of FIG. 7, and illustrates the cross-sectional structure of the leading wiring 15 of FIG. 7. As illustrated in FIGS. 7 and 8, the leading wiring 15 connecting the Sig lines 12 with the external circuit connection electrodes 16 is formed of the second electrode layers 24, and the leading wiring 15 connecting the Vs lines 11 with the external circuit connection electrodes 16 is formed of the first electrode layers 20.

That is, the leading wiring 15 leading the plurality of bias lines (Vs lines 11) to the external circuit connection electrodes 16 is formed of metal layers different from those of the leading wiring 15 leading the plurality of signal lines (Sig lines 12) to the external circuit connection electrodes 16. The formation of the leading wiring 15 of different layers as mentioned above enables the formation of all of the Sig lines 12 and the Vs lines 11 even if the pitches of the leading wiring 15 are small.

FIG. 9 is a sectional view taken along the line 9-9 of FIG. 7, and illustrates the cross-sectional structure of the Vs connecting wiring 17 to the neighborhood of the external circuit connection electrode 16 connected to the Vs connecting wiring 17. As illustrated in FIGS. 7 and 9, each of the Vs lines 11 is commonly connected by the Vs connecting wiring 17 formed of one of the first electrode layers 20 in the neighborhood of the external circuit connection electrodes 16. The Vs connecting wiring 17 is disposed to cross the plurality of Sig lines 12. The commonly connected Vs lines 11 are connected to the external circuit connection electrode 16 at the endmost part. Furthermore the Vs connecting wiring 17 is disposed on the outside of the forming region of the protective layer 27.

That is, similarly to the first embodiment, the Vs lines 11 and the Sig lines 12 are alternately disposed, and the Vs lines 11 and the Sig lines 12 are disposed at substantially the same interval, within the region in which the protective layer 27 is formed. Consequently, even if the protective layer 27 using the polarized solvent is disposed, the parasitic capacitance of each of the signal lines 12 is substantially the same, and the image unevenness can be reduced.

Moreover, as illustrated in FIG. 9, the external circuit connection electrodes 16 are formed of the second electrode layers 24 and the third electrode layers 25. The second insulating layer 26 on the second electrode layers 24 and the third electrode layers 25 are configured so that only the parts in which external circuits are connected are removed, and the respect is different from the configuration of the first embodiment. Although the impurity semiconductor layers 23, the semiconductor layers 22, and the first insulating layer 21 are disposed below the leading wiring 15 and the external circuit connection electrodes 16 in the present embodiment, these layers 23, 22, and 21 are not necessarily needed to be disposed.

Third Embodiment

Figure 10:
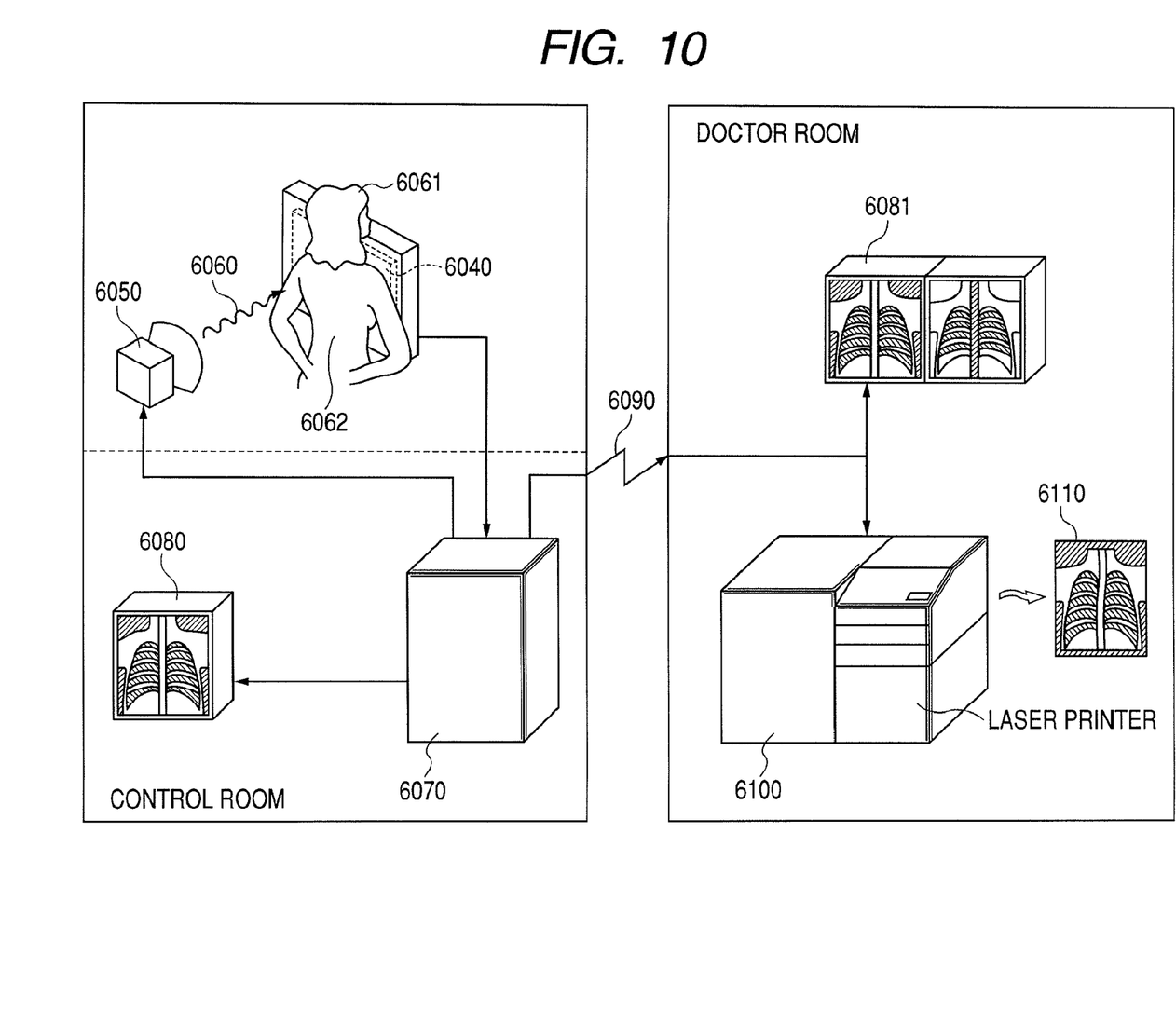
FIG. 10 is a schematic view illustrating an embodiment of a radiation imaging system using a radiation imaging apparatus of the present invention.

FIG. 10 illustrates an X-ray diagnosis system as an embodiment of a radiation imaging system using a radiation imaging apparatus as an imaging apparatus according to the present invention.

As illustrated in FIG. 10, an X-ray 6060 generated by an X-ray tube 6050, which is a radiation source, penetrates the breast 6062 of a patient or a subject 6061, and enters a radiation imaging apparatus 6040 to radiograph a radiation image. The incident X-ray 6060 includes the information of the internal portion of the patient 6061. The scintillator layer of the radiation imaging apparatus 6040 emits lights correspondingly to the incidence of the X-ray 6060, and electric information is obtained by performing the photoelectric conversions of the emitted lights.

The electric information is processed by a signal processing unit. That is, this information is converted by a digital conversion, and is subjected to the image processing by an image processor 6070. Then, the information can be observed by means of a display 6080 as a display unit situated in a control room.

Moreover, this information can be transferred to a remote location by a transmission processing unit, such as a communication circuit 6090. The information can be displayed on a display 6081, which is a display unit, in a doctor room or the like at another place, or can be saved in a recording unit, such as a laser disk. This enables a doctor at a remote location to diagnose. Moreover, it is also possible to record the information in a film 6110 by a film processor 6100, which is a recording unit.

As many apparently widely different embodiments of the present invention can be made without departing from the spirit and scope thereof, it is to be understood that the invention is not limited to the specific embodiments thereof except as defined in the claims.

This application claims priority from Japanese Patent Application No. 2007-205472 filed on Aug. 7, 2008, which is hereby incorporated by reference herein.

What is claimed is:

1. An imaging apparatus comprising:
a plurality of pixels each having a conversion element for converting incident radiation into an electric signal;
a plurality of bias wirings for applying bias to each of said conversion elements;
a plurality of signal wirings for reading the electrical signal of each of said pixels; and
a protective layer disposed over said plurality of pixels,
wherein said the plurality of bias lines and said plurality of signal lines are alternately disposed at a predetermined interval within a region in which said protective layer is disposed,
wherein a connecting wiring is arranged for commonly connecting said plurality of bias lines,
wherein said connecting wiring is connected to said plurality of bias lines outside of said region, and
wherein said connecting wiring is arranged to cross said plurality of signal lines, and said connecting wiring is not connected to said plurality of signal lines outside of said region.

2. The imaging apparatus according to claim 1, wherein a leading wiring for leading out said plurality of bias lines into an external circuit connecting electrode and a leading wiring for leading out said plurality of signal lines into an external circuit connecting electrode are formed from different metal layers.

3. The imaging apparatus according to claim 1, wherein each of said plurality of pixels further has a switching element connected to said conversion element, said conversion element is a photoelectric conversion element, and said imaging apparatus further comprises a scintillator layer.

4. An imaging system comprising:
an imaging apparatus according to claim 1;
a signal processing unit for processing a signal from said imaging apparatus.

5. A sensor substrate, for converting an incident into an electric signal, comprising:
a plurality of pixels each having a conversion element for converting incident radiation into an electric signal;
a plurality of bias wirings for applying bias to each of said conversion elements;
a plurality of signal wirings for reading the electrical signal of each of said pixels; and
a protective layer disposed over said plurality of pixels, wherein said plurality of bias lines and said plurality of signal lines are alternately disposed at a predetermined interval within a region in which said protective layer is disposed; and
a connecting wiring for commonly connecting said plurality of bias lines,
wherein the connecting wiring is connected to said plurality of bias lines outside of said region, and
wherein said connecting wiring is arranged to cross said plurality of signal lines, and said connecting wiring is not connected to said plurality of signal lines outside of said region.

* * * * *